United States Patent
Cosley et al.

(10) Patent No.: US 6,366,464 B1
(45) Date of Patent: Apr. 2, 2002

(54) CARD CAGE FOR CIRCUIT CARDS IN AN OPTICAL NETWORK UNIT

(75) Inventors: Michael R. Cosley, Crystal Lake, IL (US); John Matthes, Southlake, TX (US); James Zipper, Addison, IL (US); Barry Joe Ethridge, Fort Worth; Mahlon Danny Kimbrough, Bedford, both of TX (US)

(73) Assignee: Marconi Communications, Inc., Cleveland, OH (US)

( * ) Notice: Subject to any disclaimer, the term of this patent is extended or adjusted under 35 U.S.C. 154(b) by 0 days.

(21) Appl. No.: 09/375,312

(22) Filed: Aug. 16, 1999

(51) Int. Cl.[7] .................................................. H05K 5/00
(52) U.S. Cl. ........................ 361/752; 361/753; 361/707; 361/785; 361/796; 361/825; 361/827; 174/38; 174/72 R
(58) Field of Search ................................. 361/752, 753, 361/704, 709, 711, 784–786, 788, 796, 797, 802–803, 810–813, 822–825; 174/38, 72 R, 177 F

(56) References Cited

U.S. PATENT DOCUMENTS

| | | | |
|---|---|---|---|
| 4,237,546 A | * 12/1980 | Wells ......................... 364/900 |
| 5,046,067 A | 9/1991 | Kimbrough |
| 5,069,516 A | * 12/1991 | Koby et al. ................. 350/96.1 |
| 5,083,238 A | * 1/1992 | Bousman ..................... 361/413 |
| 5,117,067 A | 5/1992 | Jaycox |
| 5,210,374 A | 5/1993 | Channell |
| 5,257,122 A | 10/1993 | Dubal et al. |
| 5,301,050 A | 4/1994 | Czerwiec et al. |
| 5,303,229 A | 4/1994 | Withers et al. |
| 5,315,489 A | * 5/1994 | McCall et al. ............... 361/801 |
| 5,361,293 A | 11/1994 | Czerwiec |
| 5,396,575 A | 3/1995 | Hayward et al. |
| 5,500,753 A | 3/1996 | Sutherland |
| 5,600,469 A | 2/1997 | Yamazaki |
| 5,619,498 A | 4/1997 | Sharpe |
| 5,666,487 A | 9/1997 | Goodman et al. |
| 5,680,391 A | 10/1997 | Barron et al. |
| 5,715,348 A | 2/1998 | Falkenberg et al. |
| 5,724,468 A | 3/1998 | Leone et al. |
| 5,828,807 A | 10/1998 | Tucker et al. |
| 5,892,658 A | * 4/1999 | Urda et al. .................. 361/704 |
| 5,894,477 A | 4/1999 | Brueckheimer et al. |
| 6,038,138 A | * 3/2000 | Dayton et al. ............... 361/796 |

FOREIGN PATENT DOCUMENTS

FR    2699364    6/1994

* cited by examiner

*Primary Examiner*—Jeffrey Gaffin
*Assistant Examiner*—Tuan Dinh
(74) *Attorney, Agent, or Firm*—Jones, Day, Reavis & Pogue

(57) ABSTRACT

An ONU includes circuit cards, a card cage, and electrical connector hardware. The card cage releaseably engages and supports the circuit cards in installed positions in the card cage. At least one pair of the circuit cards have serial interconnections with each other. The electrical connector hardware defines all of those serial interconnections and is free of a backplane.

8 Claims, 5 Drawing Sheets

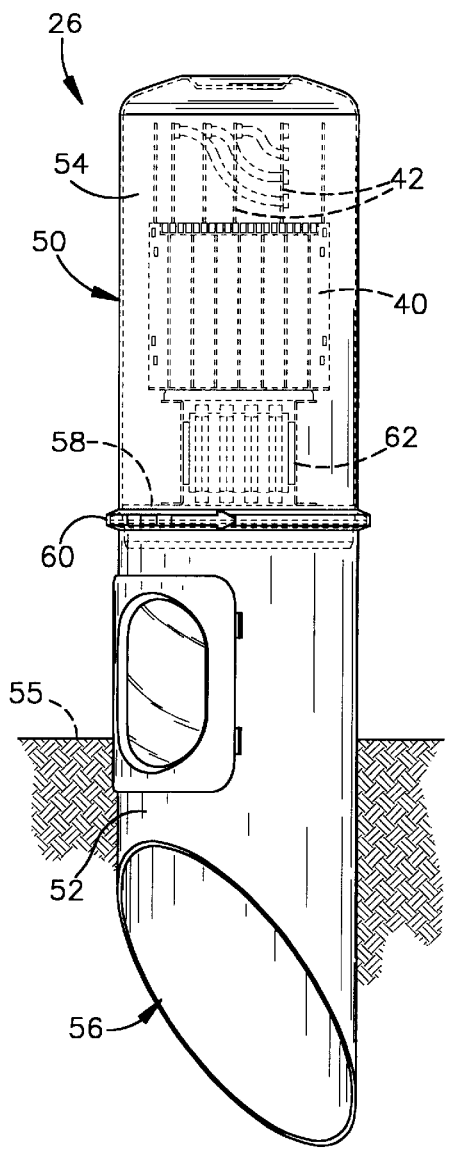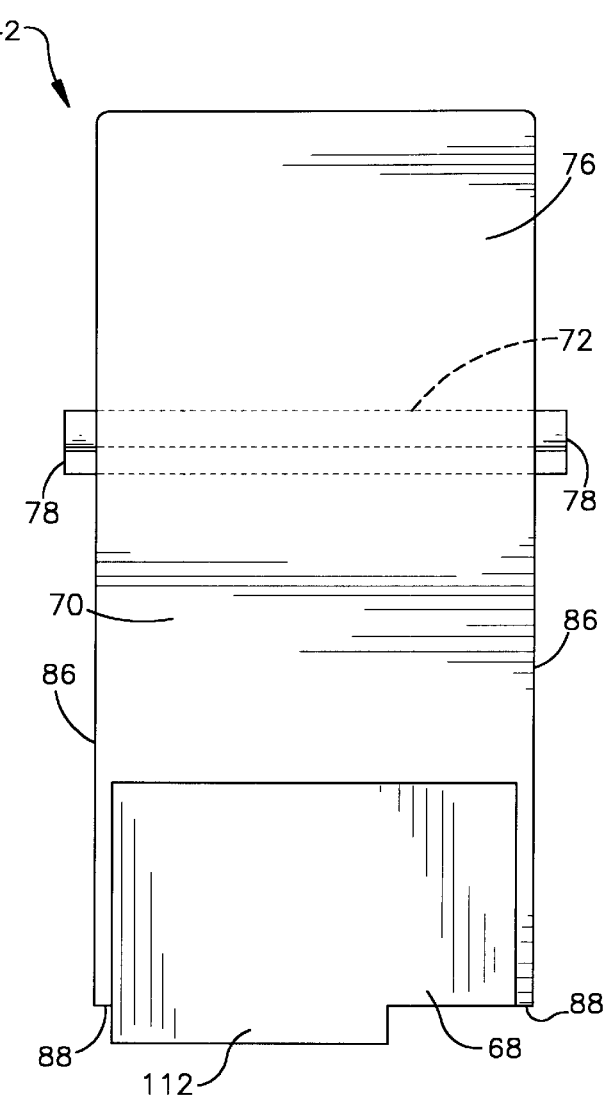
Fig.2
Fig.3

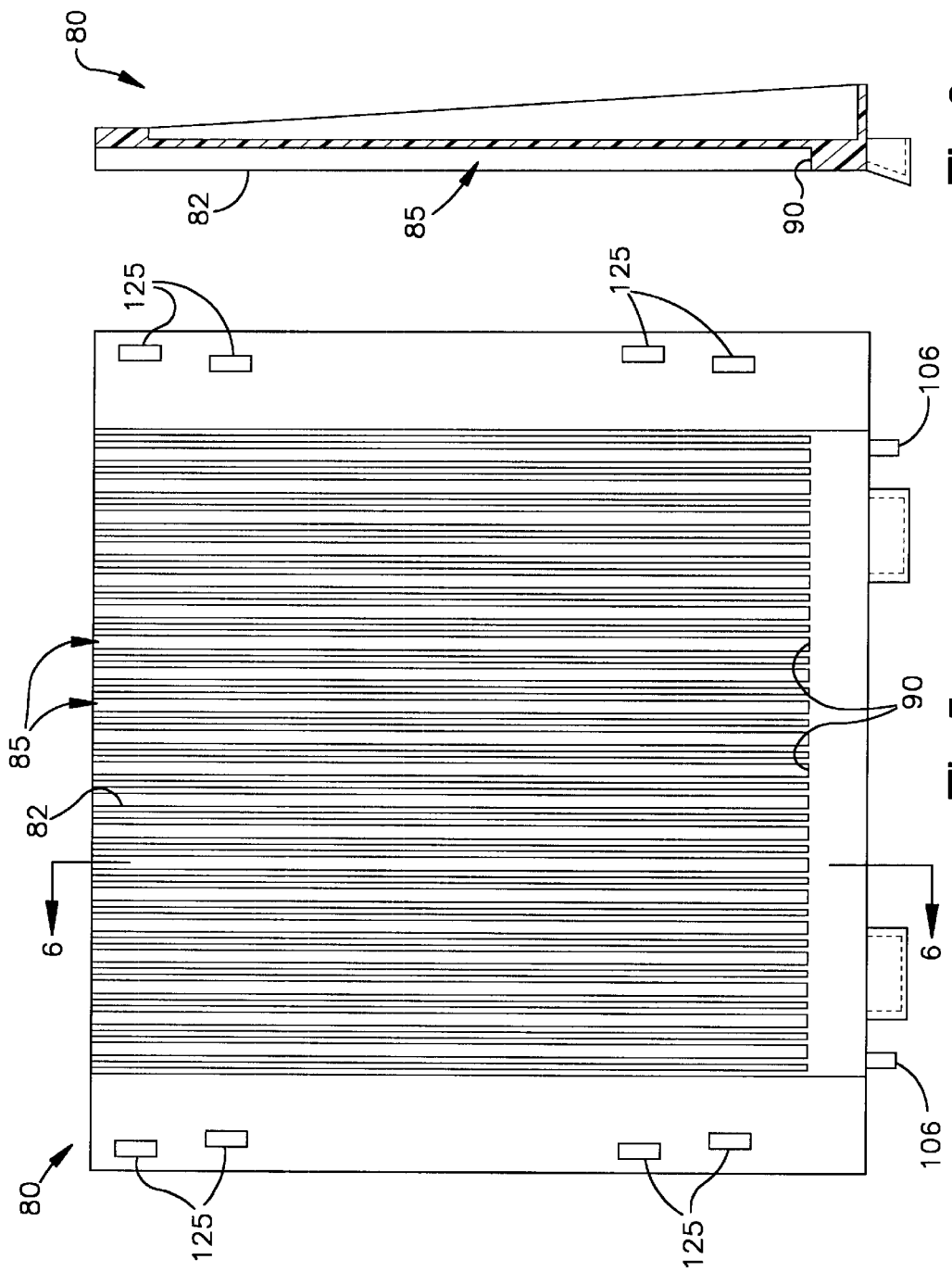

CARD CAGE FOR CIRCUIT CARDS IN AN OPTICAL NETWORK UNIT

BACKGROUND OF THE INVENTION

The present invention relates to an optical network unit (ONU) which interconnects sources of telecommunications services with customer equipment at one or more customer premises. The present invention particulary relates to a card cage that supports circuit cards in installed positions in an ONU.

An ONU may contain a group of circuit cards including a common card and service cards that are electrically interconnected with the common card. Each service card has circuitry corresponding to a particular telecommunications service provided to customers served by the ONU. The common card and the service cards are installed in a card cage structure which includes a backplane. Specifically, the common card and the service cards are supported together on the backplane in installed positions perpendicular to the backplane. The backplane is configured with circuitry that defines the electrical interconnections between the common card and the service cards.

An individual circuit card can be electrically disconnected from the other circuit cards by removing it from its installed position on the backplane, and a substitute circuit card can be installed in its place on the backplane. However, the backplane is a relatively permanent fixture in the ONU. Therefore, the adaptability of the ONU to provide differing or newly developed telecommunications services is limited by the particular backplane circuitry in the ONU.

SUMMARY OF THE INVENTION

In accordance with a principal feature of the present invention, an apparatus includes circuit cards, a card cage, and electrical connector hardware. The card cage releaseably engages and supports the circuit cards in installed positions in the card cage. At least one pair of the circuit cards have serial interconnections with each other. The electrical connector hardware defines all of those serial interconnections and is free of a backplane.

In accordance with another principal feature of the invention, the circuit cards are accessible for electrical interconnection with each other, and electrical disconnection from each other, while remaining in their installed positions in the card cage. Side walls of the card cage engage and support the circuit cards orthogonally between the side walls. The side walls are configured to receive and guide movement of each circuit card between the side walls for installation and removal of the circuit cards from their installed positions separately from each other.

In accordance with yet another principal feature of the invention, the card cage has an end wall facing between the side walls. The end wall also engages the circuit cards and is free of backplane circuitry for defining serial interconnections between the circuit cards. In a preferred embodiment of the invention, the end wall functions as a heat sink to conduct heat from the circuit cards. The end wall in the preferred embodiment further provides the circuit cards with parallel electrical interconnections consisting of ground connections. This feature of the end wall is especially beneficial in the absence of backplane circuitry that might otherwise provide the circuit cards with ground connections.

BRIEF DESCRIPTION OF THE DRAWINGS

FIG. 2 shows an example of a structure common to several of the system components shown schematically in FIG. 1;

FIG. 3 shows an example of a structure common to several parts shown in FIG. 2;

FIG. 5 is an elevational view of a part shown in FIG. 4;

FIG. 6 is a view taken on line 6—6 of FIG. 5;

DESCRIPTION OF A PREFERRED EMBODIMENT

Figure 1:
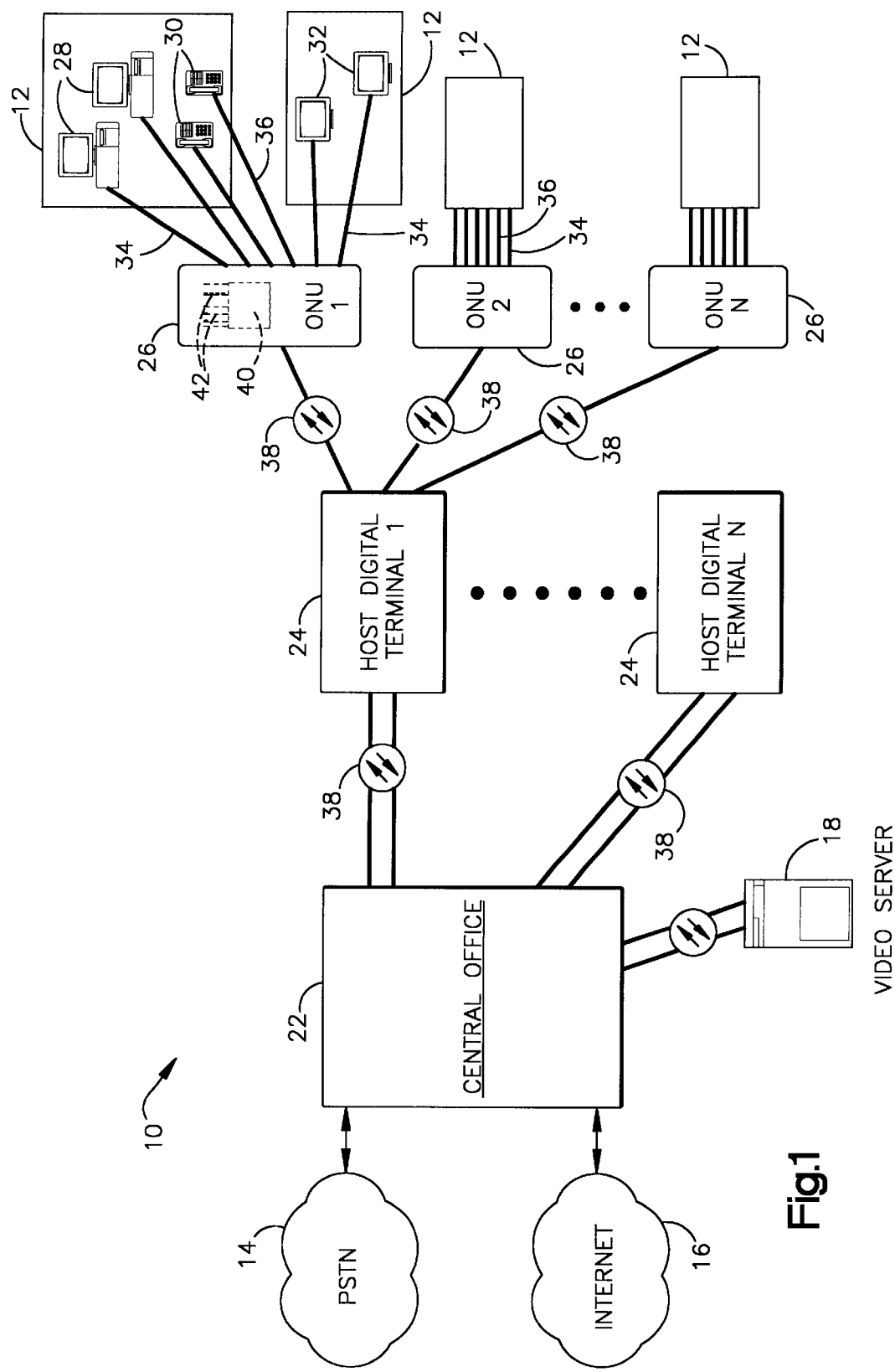
FIG. 1 is a schematic view of a telecommunications system comprising a preferred embodiment of the present invention.

A telecommunications system 10 comprising a preferred embodiment of the present invention is shown schematically in FIG. 1. The system 10 is a fiber-to-the-curb (FTTC) system connecting a plurality of customer premises 12 with various sources of telecommunication services. As shown for example in FIG. 1, the service sources include the public switched telephone network 14, the Internet 16, and a video server 18, and additional service sources also could be included. The FTTC system 10 includes a central office switching station 22, a plurality of host digital terminals 24, and a plurality of ONU's 26.

Each ONU 26 communicates with customer equipment at one or more customer premises 12. The customer equipment typically includes computers 28, telephones 30 and televisions 32. The ONU's are connected with the customer equipment 28, 30 and 32 by coaxial cables 34 and copper wires 36. Each host digital terminal 24 is connected with a respective group of ONU's 26, and also with the central office switching station 22, by optical fiber cables 38. The central office switching station 22 connects the host digital terminals 24 with the service sources 14–18 in a known manner.

As shown schematically in FIG. 1, each ONU 26 includes a card cage 40. A plurality of circuit cards 42 are installed and electrically interconnected in the card cage 40. The circuit cards 42 at each ONU 26 correspond to the telecommunications services required at the customer premises 12 served by the ONU 26. For example, the circuit cards 42 at any one of the ONU's 26 may include a common card interconnected with a plurality of service cards, with each service card having circuitry corresponding to a particular telecommunications service, such as high speed Internet access, digital television, etc. In accordance with the present invention, the card cage 40 does not include a backplane. Moreover, the card cage 40 is configured such that the telecommunications services provided by the ONU 26 can be changed or supplemented by disconnecting and replacing one or more circuit cards 42 while the other circuit cards 42 remain installed and electrically interconnected in the card cage 40.

The ONU's 26 in the preferred embodiment are pedestal type structures. As shown for example in FIG. 2, the pedestal configuration is defined by a cylindrical housing 50 with a base 52 and a dome 54. The base 52 of the housing 50 projects upward from beneath the ground line 55. The cables and wires 34, 36 and 38 of FIG. 1, as well as a power cable (not shown), are routed upward into the housing 50 through an open lower end 56 of the base 52. The dome 54 is received over a circular bulkhead 58 at the upper end of the base 52. A band clamp 60 or the like is used to interlock the dome 54 releaseably with the bulkhead 58. The card cage 40 is mounted on a structural frame 62 which, in turn, is mounted on the bulkhead 58. The circuit cards 42 are thus contained within the dome 54 and are accessible for service when the dome 54 is unlocked and removed from the bulkhead 58.

Although the circuit cards 42 have differing circuitry, as noted above, they preferably have common structural features, as shown for example in FIG. 3. Each circuit card 42 in the preferred embodiment thus has a rectangular peripheral configuration with an optional heat sink plate 68 at its lower end. The heat sink plate 68 adjoins a ground plane within the circuit card 42 so as to conduct heat from the internal circuitry and the electrical components (not shown) mounted on the component side 70 of the circuit card 42. A stiffener 72 extends across the opposite side of the circuit card 42. An upper end section 76 of the circuit card 42 is located above the stiffener 72. Retainers 78 at the ends of the stiffener 72 project transversely from the circuit card 42.

Figure 4:
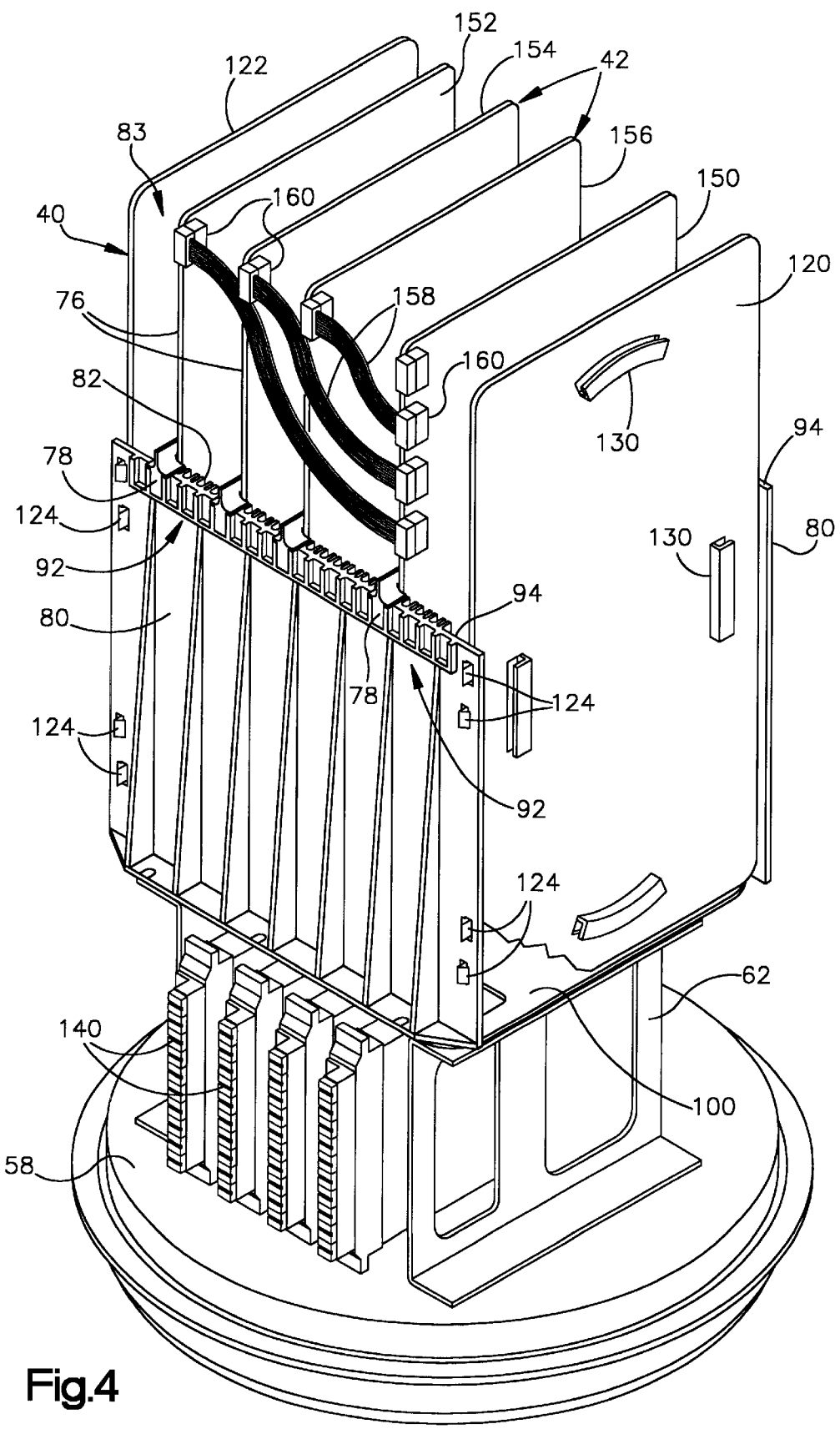
FIG. 4 is an isometric view of parts shown in FIG. 2.

Each card cage 40 in the preferred embodiment is a rectangular box with a pair of opposed plastic side walls 80, as shown in FIG. 4. The side walls 80 engage and support the circuit cards 42 in installed positions in which the circuit cards 42 extend orthogonally between the side walls 80. More specifically, the side walls 80 are alike and have opposed guide structures 82. The guide structures receive the circuit cards 42 upon insertion of the circuit cards 42 through an open upper end 83 of the card cage 40, and guide movement of the circuit cards 42 vertically between the side walls 80 upon installation and removal of the circuit cards 42 from their installed positions in the card cage 40.

As best shown in FIGS. 5 and 6, the guide structures 82 in the preferred embodiment define vertically elongated slots 85. Each pair of opposed slots 85 receives opposite side edge portions 86 of a single circuit card 42. This enables each circuit card 42 to be guided vertically into and out of its installed position separately from each other circuit card 42. When the circuit cards 42 are moved vertically downward between the side walls 80 fully to their installed positions, lower edge surfaces 88 (FIG. 3) of the circuit cards 42 move into abutment with the side walls 80 at stop surfaces 90 (FIGS. 5 and 6) at the lower ends of the slots 85. The retainers 78 projecting transversely from the circuit cards 42 are simultaneously moved into corresponding slots 92 at the upper ends 94 of the side walls 80. The upper end sections 76 of the circuit cards 42 are then accessible for electrical interconnection with each other, and electrical disconnection from each other, outward of the side walls 80 while remaining in their installed positions in the card cage 40.

Figure 7:
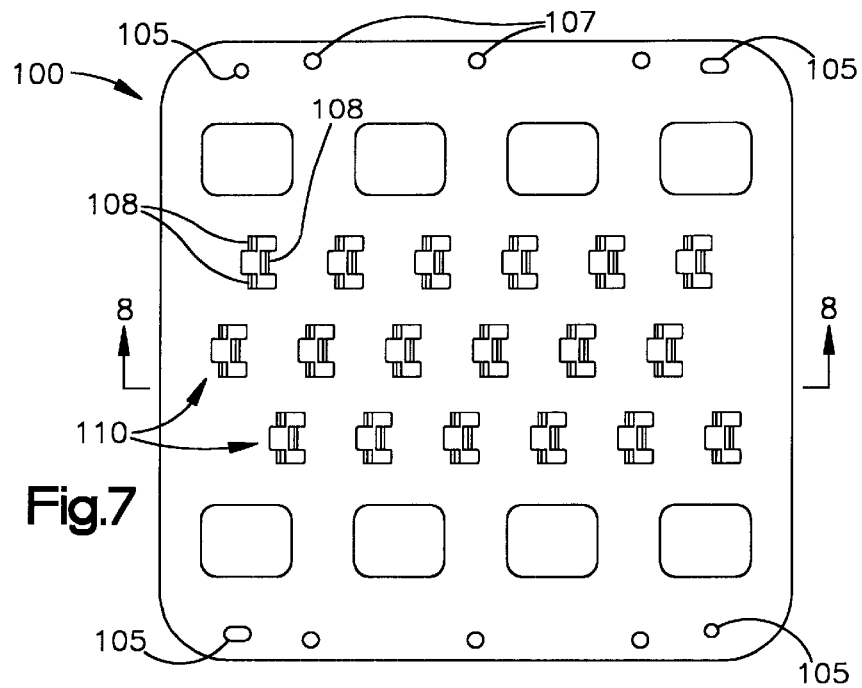
FIG. 7 is a plan view of a part shown in FIG. 4.
Figure 8:
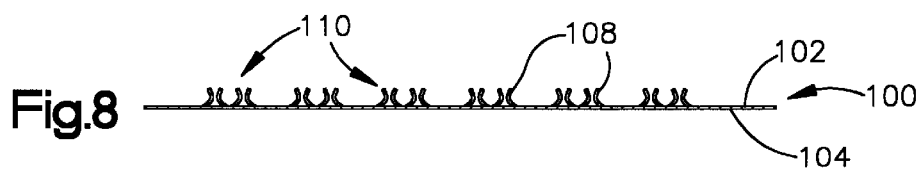
FIG. 8 is view taken on line 8—8 of FIG. 7.

An end wall 100 of the card cage 40 faces upward between the side walls 80. As shown separately in FIGS. 7 and 8, the end wall 100 is a metal plate with parallel upper and lower side surfaces 102 and 104. Apertures 105 are provided near the four corners of the end wall 100 for pegs 106 on the side walls 80 to be heat-staked to the end wall 100. Additional apertures 107 in the end wall 100 receive fasteners (not shown) that fasten the end wall 100 to the structural frame 62 (FIG. 4).

Support tabs 108 project vertically from the upper side surface 102 of the end wall 100. The support tabs 108 are arranged in a staggered array of groups 110 such that each group 110 of support tabs 108 corresponds to a pair of opposed slots 85 in the side walls 80. When a circuit card 42 is installed in the card cage 40, a lower edge portion 112 of the heat sink plate 68 on the circuit card 42 is releaseably engaged by a corresponding set 110 of support tabs 108 on the end wall 100. In accordance with this feature of the invention, the end wall 100 can function as a heat sink for the circuit cards 42, and can also provide parallel ground connections for the circuit cards 42.

The card cage 40 further includes a pair of opposed plastic side walls 120 and 122 that are parallel to the circuit cards 42. These side walls 120 and 122 have substantially the same peripheral size and shape as the circuit cards 42, and thus project upward from the upper ends 94 of the other side walls 80 equally with the circuit cards 42. Locking tabs 124 on the vertically projecting side walls 120 and 122 are received through apertures 125 in the shorter side walls 80 to lock the side walls 120, 122 and 80 together. However, any other suitable fastening structures could be used to interconnect the various walls 80, 100, 122 and 124 of the card cage 40.

Figure 9:
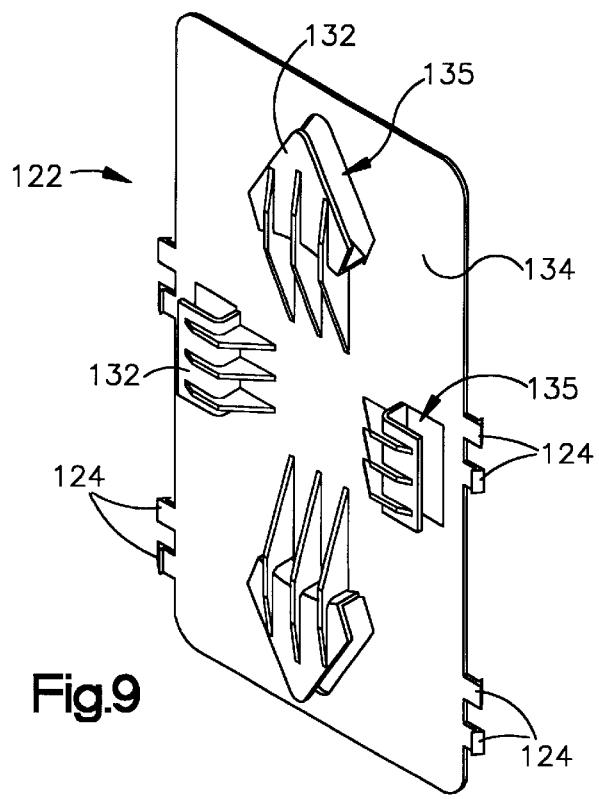
FIG. 9 is an isometric view of another part shown in FIG. 4.

As shown in FIG. 4, one of the vertically projecting side walls 120 has a cable management structure including an array of retainer tabs 130 around which optical fiber cables can be wound and stored on the card cage 40. As shown in FIG. 9, the other vertically projecting side wall 122 has an alternative embodiment of a cable management structure including a similar array of retainer tabs 132. Those retainer tabs 132 are sized and shaped to support wound copper drop cables or other larger cables, and are spaced from the major section 134 of the side wall 122 to define a corresponding array of passages 135. The passages 135 enable spliced wires (not shown) to extend through the side wall 122 for interconnection of the circuit cards 42 with a plurality of connectors 140 that are mounted on the structural frame 62. The connectors 140 in the preferred embodiment comprise URLS protection cartridges and blocks, and are interconnected with the cables and wires 34, 36 and 38 (FIG. 1) in a known matter.

As further shown in FIG. 4, the circuit cards 42 in the preferred embodiment 20 include a common card 150 and a plurality of service cards 152, 154 and 156. Serial connections are made between the common card 150 and each of the service cards 152–156 by ribbon cables 158. The ribbon cables 158 extend between connectors 160 on the upper end sections 76 of the circuit cards 150–156. Although the preferred embodiment of the invention includes the ribbon cables 158 and the connectors 160, serial connections between the circuit cards 42 can be made by any other suitable electrical hardware, such as cables, wires, optical fibers, or the like, with corresponding connectors on the cards 42. Importantly, any one or more of these circuit cards 150–156 can be disconnected from the ribbon cables 158 and replaced with a different circuit card without necessarily disconnecting and removing the remaining circuit cards from their installed positions in the card cage 40. One or more additional common cards and service cards can likewise be installed and interconnected at various suitable locations in the card cage 40. The existing circuit cards 150–156 could remain installed and interconnected with each other while the additional cards are being installed and interconnected. Alternatively, the spacing and locations of the existing circuit cards 150–156 could be varied to accommodate the additional cards. Since the card cage 40 is free of a backplane, such adaptations to the ONU 26 can be made to provide differing or newly developed telecommunications services without limitations dictated by backplane circuitry.

The present invention has been described with reference to a preferred embodiment. Improvements, changes and modifications to the preferred embodiment may be contemplated by those skilled in the art as taught by the foregoing description. Such improvements, changes and modifications are intended to be covered by the appended claims.

We claim:

1. An apparatus comprising:

a pedestal housing configured to enclose connections that communicate customer premises with sources of telecommunications services;

a card cage configured to support circuit cards that define said connections within said housing, said card cage having opposed side walls configured to engage and support the circuit cards in installed positions in which the circuit cards extend orthogonally between said side walls;

said card cage further having an end wall facing outward between said side walls, said end wall being free of backplane circuitry for defining serial interconnections between the circuit cards and comprising a heat sink structure configured to engage and conduct heat from the circuit cards when the circuit cards are in their installed positions.

2. An apparatus as defined in claim 1 further comprising a plurality of the circuit cards in their installed positions, with each of said plurality of circuit cards having a heat sink structure engaged in contact with said heat sink structure on said end wall.

3. Apparatus as defined in claim 1 wherein said end wall is configured to engage and provide the circuit cards with parallel electrical interconnections, whereby said end wall can engage and provide the circuit cards with parallel ground connections.

4. An apparatus as defined in claim 3 wherein said end wall comprises a metal plate that defines said heat sink structure and provides said parallel electrical interconnections.

5. An apparatus as defined in claim 4 wherein said metal plate has tabs configured to engage edge portions of the circuit cards when the circuit cards are in their installed positions.

6. Apparatus as defined in claim 1 wherein said side walls of said card cage define pairs of opposed guide structures configured to receive and guide movement of each circuit card between said side walls for installation and removal of the circuit cards separately from each other, and said side walls further define stop surfaces against which the circuit cards are moved into abutment with said side walls upon being moved fully to their installed positions.

7. Apparatus as defined in claim 6 wherein said guide structures define slots and said stop surfaces define ends of said slots.

8. Apparatus as defined in claim 7 wherein said card cage has a wall with a cable management structure configured to support a quantity of stored cable wound around said cable management structure.

* * * * *